United States Patent
Hopf

(10) Patent No.: US 7,406,404 B2
(45) Date of Patent: Jul. 29, 2008

(54) METHOD FOR DEVELOPING A MACHINE

(75) Inventor: Ronny Hopf, Klingenthal (DE)

(73) Assignee: Siemens Aktiengesellschaft, München (DE)

( * ) Notice: Subject to any disclaimer, the term of this patent is extended or adjusted under 35 U.S.C. 154(b) by 539 days.

(21) Appl. No.: 11/040,199

(22) Filed: Jan. 21, 2005

(65) Prior Publication Data
US 2005/0171743 A1  Aug. 4, 2005

(30) Foreign Application Priority Data
Jan. 21, 2004 (DE) .................. 10 2004 003 167

(51) Int. Cl.
G06F 17/50 (2006.01)

(52) U.S. Cl. .................. 703/1; 703/2; 703/22; 700/30; 700/32

(58) Field of Classification Search .................. 703/2, 703/22, 1; 700/197, 28–32, 159; 717/100
See application file for complete search history.

(56) References Cited

U.S. PATENT DOCUMENTS

| | | | |
|---|---|---|---|
| 5,490,097 A * | 2/1996 | Swenson et al. | ............... 703/2 |
| 5,666,297 A | 9/1997 | Britt et al. | |
| 6,606,740 B1 | 8/2003 | Lynn et al. | |
| 6,633,788 B1 | 10/2003 | Riley et al. | |
| 6,738,736 B1 * | 5/2004 | Bond | ............... 703/2 |

FOREIGN PATENT DOCUMENTS

| DE | 196 14 991 C2 | 10/1996 |
|---|---|---|
| DE | 200 14 112 | 11/2000 |

OTHER PUBLICATIONS

Haug et al., K. Robust Laser-stripe Sensor for Automated Weld-seam-tracking the Shipbuilding Industry, Proceedings of the 24th Annual Conf. of the Industrial Electronics Society, vol. 2, Aug.-Sep. 1998, pp. 1236-1241.*

Pritschow et al., G. Fast and Robust Image Processing for Laser Stripe-sensors in Arc Welding Automation, Proceedings of the 2002 IEEE Int. Symp. on Industrial Electronics, Jul. 2002, pp. 651-656.*

* cited by examiner

Primary Examiner—Russell Frejd
(74) Attorney, Agent, or Firm—Henry M. Feiereisen; Ursula B. Day

(57) ABSTRACT

In a method for developing a machine for producing a product, properties of the product to be produced are defined and tasks to be performed for producing the product are defined. The tasks are subdivided into a plurality of sub-tasks, and, based on the sub-tasks, an algorithm is established for producing the product in a virtual model, wherein hardware and control functions are established simultaneously. A machine that implements the algorithm and the control functions can then be constructed, with the control functions implemented as reconfigurable hardware.

4 Claims, 3 Drawing Sheets

METHOD FOR DEVELOPING A MACHINE

CROSS-REFERENCES TO RELATED APPLICATIONS

This application claims the priority of German Patent Application, Serial No. 10 2004 003 167.3, filed Jan. 21, 2004, pursuant to 35 U.S.C. 119(a)-(d).

BACKGROUND OF THE INVENTION

The present invention relates to a method for developing a machine for producing a product, wherein control functions of the machine are implemented by way of reconfigurable hardware.

Nothing in the following discussion of the state of the art is to be construed as an admission of prior art.

A controller for a machine, in particular for a machine tool, is typically selected from a number of commercially available standard controllers. However, a significant portion of the resources of the standard controllers often remains unused. Programming and parameterizing the controller for a particular application can be complex and can be the source of major errors.

It would therefore be desirable and advantageous to provide an improved method for defining the control functions of a machine, which obviates prior art shortcomings and is able to provide the flexibility to economically adapt hardware and control functions to one or more particular applications of the machine.

SUMMARY OF THE INVENTION

According to one aspect of the present invention, a method for developing a machine for producing a product includes the steps of defining properties of the product to be produced, defining tasks to be performed for producing the product, subdividing the tasks into a plurality of sub-tasks, based on the sub-tasks, establish an algorithm for producing the product in a virtual model, wherein hardware and control functions are established simultaneously, and constructing a machine that implements the algorithm and the control functions, with the control functions implemented as reconfigurable hardware.

The proposed method for developing a machine for producing a product is based on the properties of the product. The properties of the product define the tasks to be performed for producing product, which are then divided into several sub-tasks. At this stage of the process, no distinction is made between mechanical functions of the machine and control functions. Instead, based on the sub-tasks to be performed, an algorithm is synthesized in a virtual model that describes the functions to be performed for producing the product. Hardware and control functions are synthesized simultaneously, providing a seamless transition between software and hardware. The functionality of the control functions is therefore defined at an early stage of the development of the machine. A high degree of design flexibility can be achieved by implementing the control functions of the machine, which is to be constructed on the basis of the algorithm synthesized in the virtual model, in the form of reconfigurable hardware, such as a field-programmable-gate-array (FPGA) in the controller that performs the control functions. However, alternatively or in addition, reconfigurable analog components can also be used for controlling the machine. The machine is advantageously implemented as a machine tool that produces a product by metal cutting.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Figure 1:
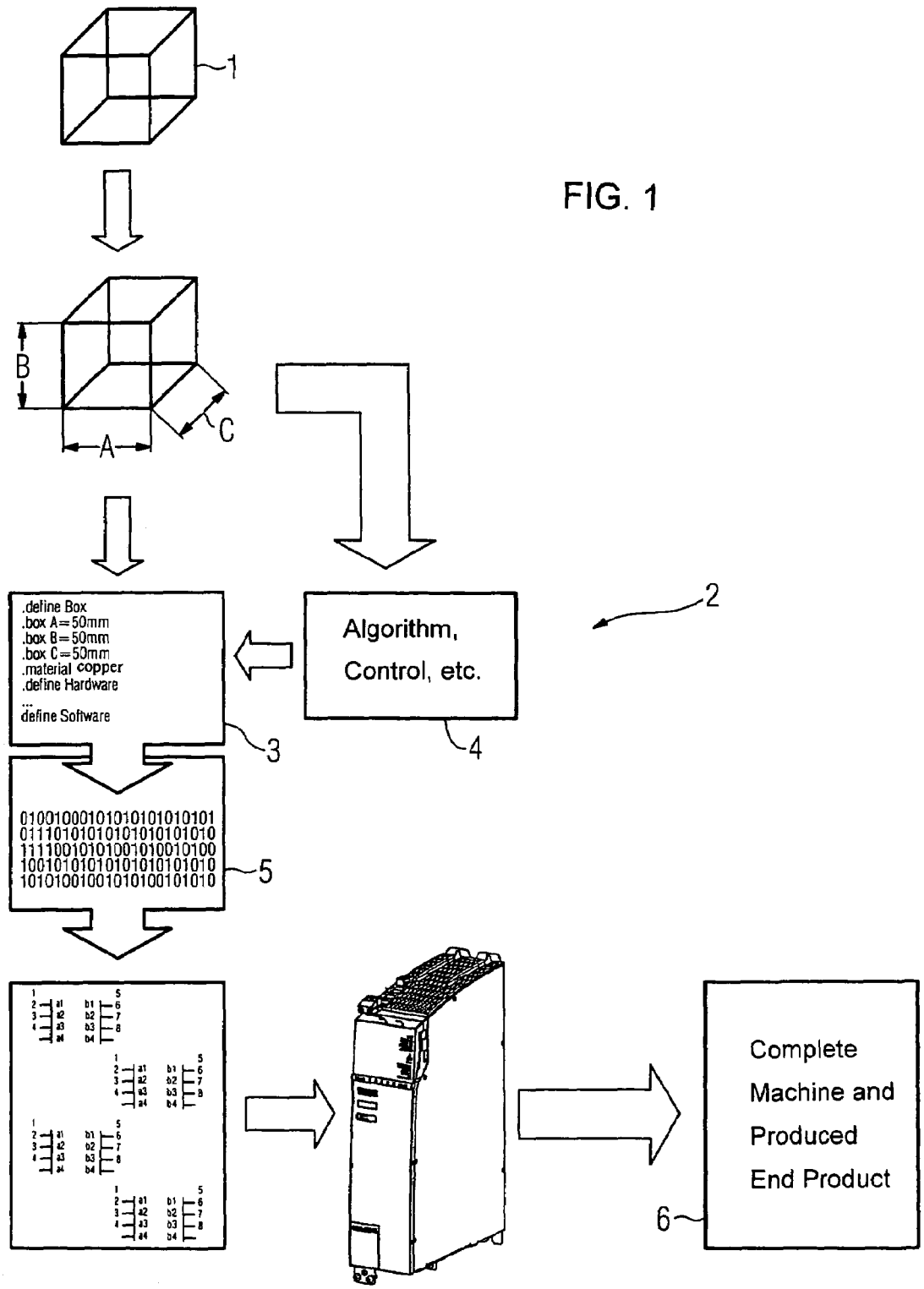
FIG. 1 illustrates in the form of a schematic flow diagram a development process for a machine according to the invention.

Throughout all the Figures, same or corresponding elements are generally indicated by same reference numerals. These depicted embodiments are to be understood as illustrative of the invention and not as limiting in any way. It should also be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

Turning now to the drawing, and in particular to FIG. 1, there is shown a process for producing a product 1, also referred to as end product, which in the depicted example is a cube made of copper having sides with a lateral dimension of 50 mm. The surface quality and other properties, such as, for example, permitted tolerances, are precisely defined. Also defined can be a maximum processing time for each cube as well as a power supply voltage available at the manufacturing site. All product properties as well as relevant quantifiable boundary conditions are defined in a development platform implemented in software. The development platform, also referred to as a development tool, is not only provided for a single product, but can include wide-ranging, broadly defined information about control functions and production flow.

By using the development platform, the tasks for producing the product 1, which can be subsequently subdivided into several sub-tasks, can be automatically deduced from the parameters of the product 1 and defined boundary conditions, also referred to as ambient parameters. In the present example, the following features are defined in software: two drives with a certain power rating are required; the movement should be performed on a predefined path; the position control has to meet certain requirements; and a power supply with certain properties is required.

The aforementioned information is supplied as a dataset 3 to a virtual model 2, which is part of the development platform. The dataset 3 includes the relevant product properties as well as, on an abstract level, all sub-tasks to be fulfilled for producing the product 1. The control functions 4 that have to be met for producing the product 1 form a part of the virtual model 2, which automatically checks if the components required for performing specific sub-tasks are available. This can refer to, for example, a path integration algorithm or a position control. If a suitable component is not available, then the respective problem is subdivided into additional sub-tasks, until the problem can be solved with the available resources. No input from a developer is required, with the developer's task being limited to defining the properties of the product 1 and other parameters that may have to be taken into consideration. The virtual model 2 then simultaneously establishes or "synthesizes" from these definitions all hardware and control functions necessary for producing the product 1. The term "simultaneously establish" or "simultaneously synthesize" is meant to indicate that software and hardware are linked into an indivisible unit, i.e., there is no longer an identifiable transition between software and hardware.

The entire process to develop the control functionality takes place in the virtual model 2 and leads to a unique hardware solution, also referred to as a final hardware configuration, that is optimal for producing the product 1. The hardware solution describes the required production steps and all properties of the controller down to the lowest plane, for example the gate plane. The developer does not need to have any information about the actual processes performed in this plane. The virtual model 2 stores the corresponding functional relationships, and it is no longer necessary to generate a particular control program for individual situations, for example for producing a specific product.

Unlike with conventional development processes, where at first the machine is constructed and the associated controller is selected or developed afterward, with the method according to the invention the tasks to solved are initially abstracted to a level so as to generate a uniform solution "from a single mold" without differentiation between hardware and software functions. Moreover, unlike conventional development processes, an off-line control is used during the synthesis in the virtual model 2. Because the control functionalities are taken into consideration early in the development process, the controller can be implemented as a pure hardware solution that operates largely without unutilized resources.

The afore-described synthesis process based on the specification of the product 1 in the virtual model 2 automatically generates an algorithm 5, also referred to as virtual hardware. In the last step of the development process, a machine 6 for producing the product 1 is constructed based on the algorithm 5 that was automatically generated in the virtual model 2. The already completely developed virtual hardware, including all control functionalities, is then converted into physical hardware. Unlike with conventional machine tools, where a processor platform processes a code, the machine 6, i.e., a machine tool, is controlled instead by a hardware-based controller derived directly from the product properties and specifically adapted for the respective task, namely the production of the product 1. The processing speed and reliability of the machine 6 can hence be significantly improved over conventional machine tools in spite of its simple configuration.

The controller of the machine 6 developed with the afore-described process is implemented as reconfigurable hardware, for example by using a field-programmable-gate-array (FPGA), enabling the machine 6 to not only produce the desired product 1, but also products with a different geometry and/or made of other materials. As mentioned above, the initially defined total task is subdivided into granular subunits or sub-tasks, so that a large number of the steps performed during the development process can be reused when the machine 6 is used for a different application. This facilitates changes in the hardware configuration when the machine 6 is employed for other tasks, and can be accomplished more easily with increasing granularity of the product 1 and increasing granularity of the tasks performed in the virtual model 2 for producing the product 1. Accordingly, the machine 6 can achieve a high degree of hardware utilization for a variety of different production tasks.

Figure 2:
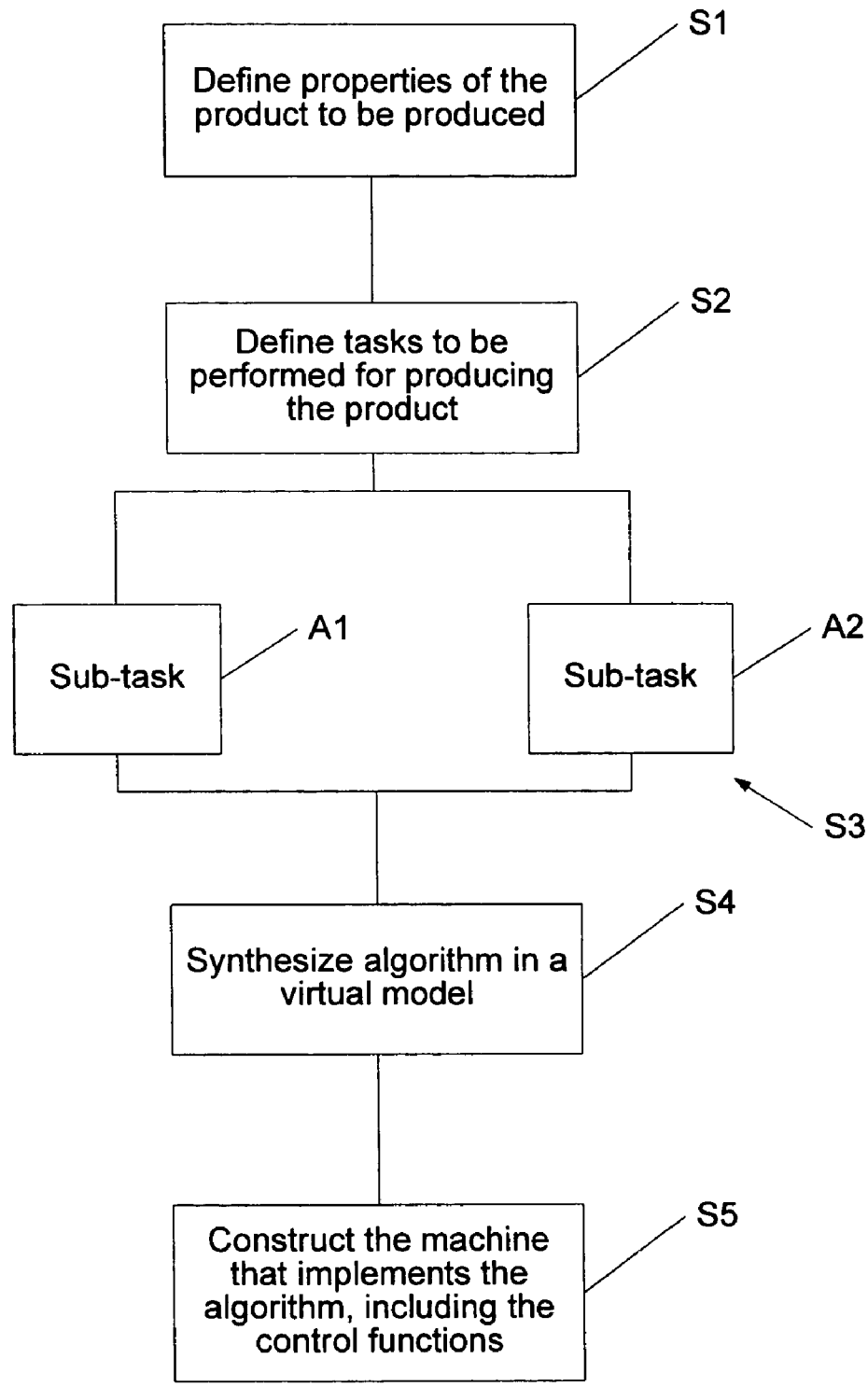
FIG. 2 is a schematic process flow diagram of the method for product development according to the invention.

FIG. 2 shows a schematic flow diagram of the development process according to the invention, which is independent of the actual product 1 and the configuration of the machine 6. In a first step S1, the properties of the product to be produced are defined. In the following step S2, the tasks to be performed for producing the product 1 are defined. These tasks are then subdivided into several sub-tasks A1, A2, step S3. The subsequent step S4 indicates the synthesis of an algorithm in a virtual model suitable for producing the product 1, based on the sub-tasks A1, A2, with the hardware and control functions of the machine to be developed being synthesized simultaneously. In a final step S5, the machine that implements the algorithm, including the control functions, is constructed. The control functions are hereby implemented as reconfigurable hardware, in particular as FPGA 9 and/or as a reconfigurable analog component 10. The entire process depicted in FIG. 2 can be executed automatically in a computer.

Figure 3:
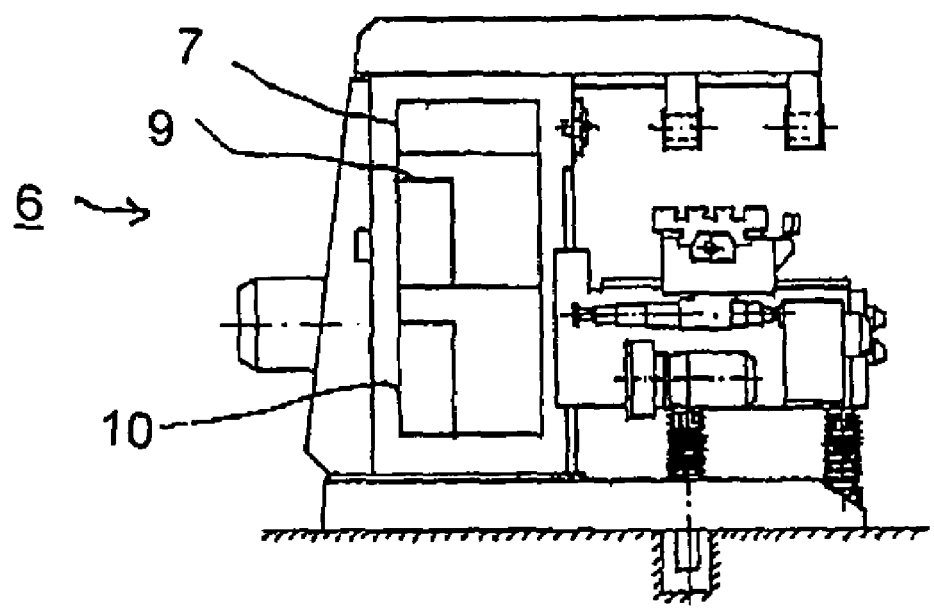
FIG. 3 shows a machine developed with the method of FIGS. 1 and 2.

FIG. 3 shows an exemplary embodiment of the machine tool 6 with a controller 7 for implementing the control functions of the machine 6. The controller 7 can also include a printed circuit board 8, as shown schematically in FIG. 1. As illustrated in FIG. 3, other components of the controller 7 of the machine 6 may include a field-programmable-gate-array (FPGA) 9 as well as a reconfigurable analog circuit 10. The controller 7, including the FPGA 9 and the reconfigurable analog circuit 10 can be developed with the integrated development process at the same time with the other components of the machine 6.

While the invention has been illustrated and described in connection with currently preferred embodiments shown and described in detail, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

What is claimed is:

1. A method for developing a machine for producing a product, comprising the steps of:

defining properties of the product to be produced;

establishing a development platform with a virtual model of the product;

in the virtual model, defining tasks to be performed for producing the product;

identifying components and control functions of the components required for performing the tasks, and if a component is not available for a task, subdividing the task into a plurality of sub-tasks;

identifying components and associated control functions required for performing the sub-tasks, and continue the identifying and subdividing until all components and associated control functions for performing all sub-tasks have been identified; and constructing the machine based on the virtual model by using simultaneously the identified components and the control functions associated with the identified components, with the control functions implemented as reconfigurable hardware.

2. The method of claim 1, wherein the machine is a machine tool.

3. The method of claim 1, wherein the reconfigurable hardware comprises a FPGA.

4. The method of claim 1, wherein the reconfigurable hardware comprises a reconfigurable analog component.

\* \* \* \* \*